United States Patent
Kim et al.

(10) Patent No.: US 8,188,801 B2
(45) Date of Patent: May 29, 2012

(54) DELAY CIRCUIT FOR LOW POWER RING OSCILLATOR

(75) Inventors: Myeung Su Kim, Gyeonggi-do (KR); Han Jin Cho, Seoul (KR); Joon Hyung Lim, Gyeonggi-do (KR); Kyung Hee Hong, Seoul (KR); Yong Il Kwon, Gyeonggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 79 days.

(21) Appl. No.: 12/878,476

(22) Filed: Sep. 9, 2010

(65) Prior Publication Data
US 2011/0309885 A1 Dec. 22, 2011

(30) Foreign Application Priority Data
Jun. 17, 2010 (KR) .................. 10-2010-0057583

(51) Int. Cl.
*H03K 3/03* (2006.01)
(52) U.S. Cl. .................. 331/183; 331/45; 331/57

(58) Field of Classification Search .................. 331/45, 331/57, 183
See application file for complete search history.

(56) References Cited

U.S. PATENT DOCUMENTS
7,573,339 B2    8/2009  Cong
2006/0164153 A1*  7/2006  Yamashida .................. 327/534

FOREIGN PATENT DOCUMENTS
KR    10-0422806 A    3/2004

* cited by examiner

*Primary Examiner* — James E Goodley
(74) *Attorney, Agent, or Firm* — Lowe, Hauptman, Ham & Berner, LLP

(57) ABSTRACT

Disclosed herein is a delay circuit for a low power ring oscillator. The delay circuit includes: a pair of N type transistors that receive first differential input signals Vin1+ and Vin1−; a pair of P type transistors that receive second differential input signals Vin2+ and Vin2−; a differential output terminal that outputs differential output signals Vout+ and Vout− generated from the pair of N type transistors and the pair of P type transistors; an N type detector that supplies a body voltage to the pair of N type transistors; and a P type detector that supplies a body voltage to the pair of P type transistors.

12 Claims, 4 Drawing Sheets

【FIG. 1】
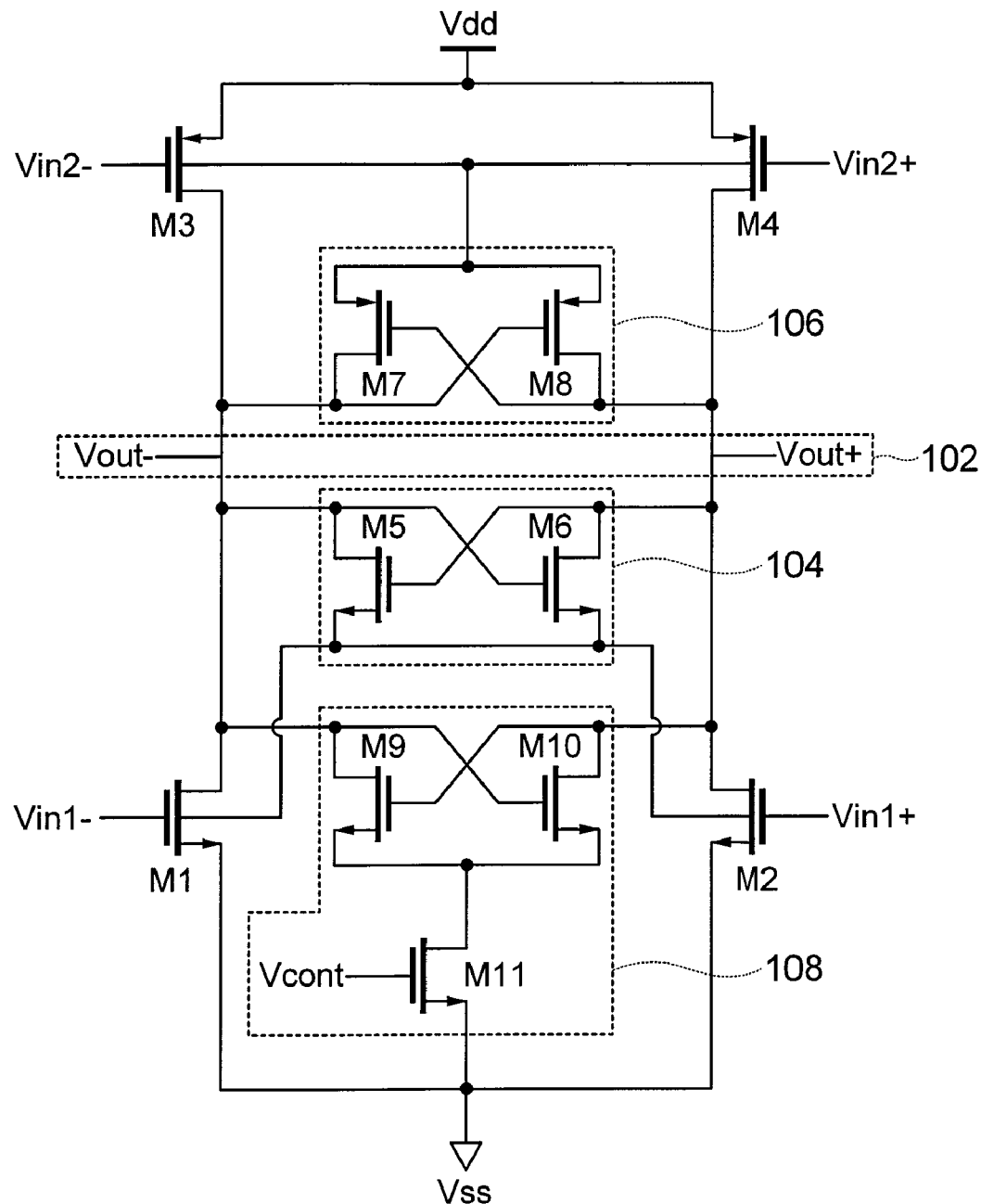

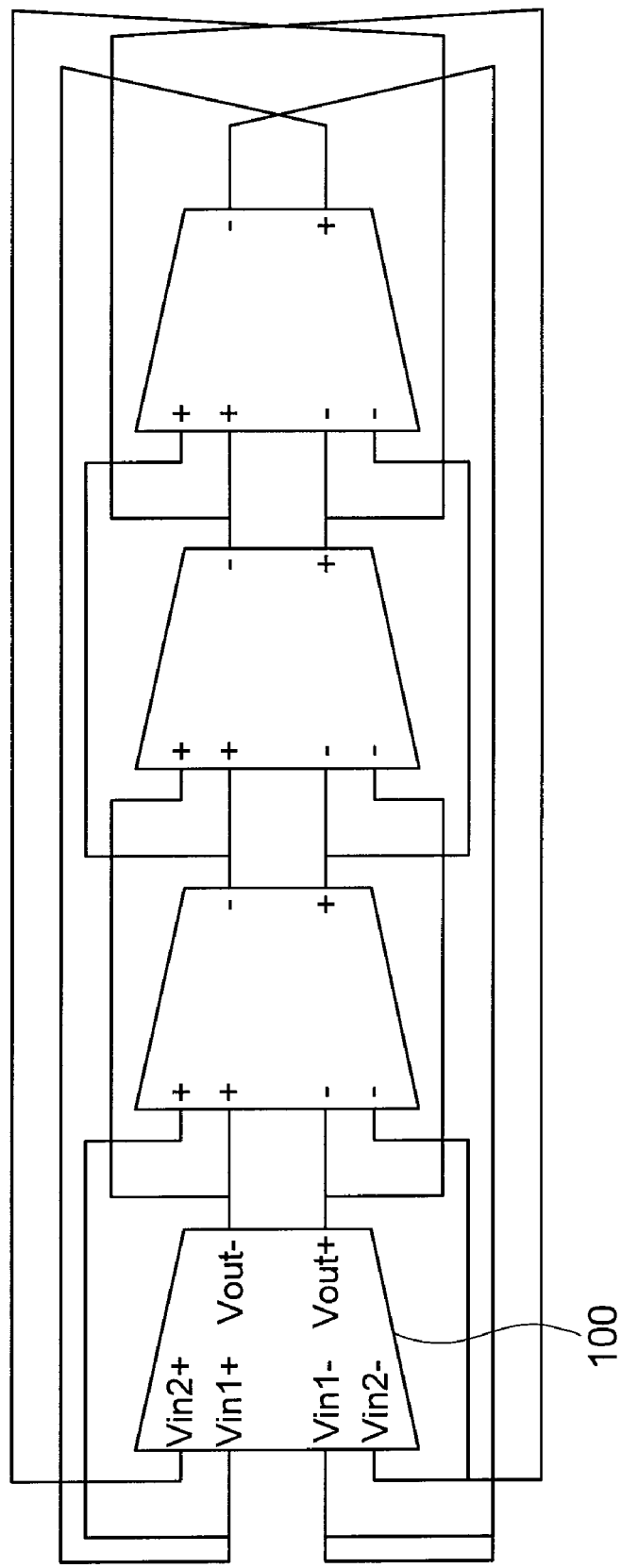
[FIG. 2]

[FIG. 3]
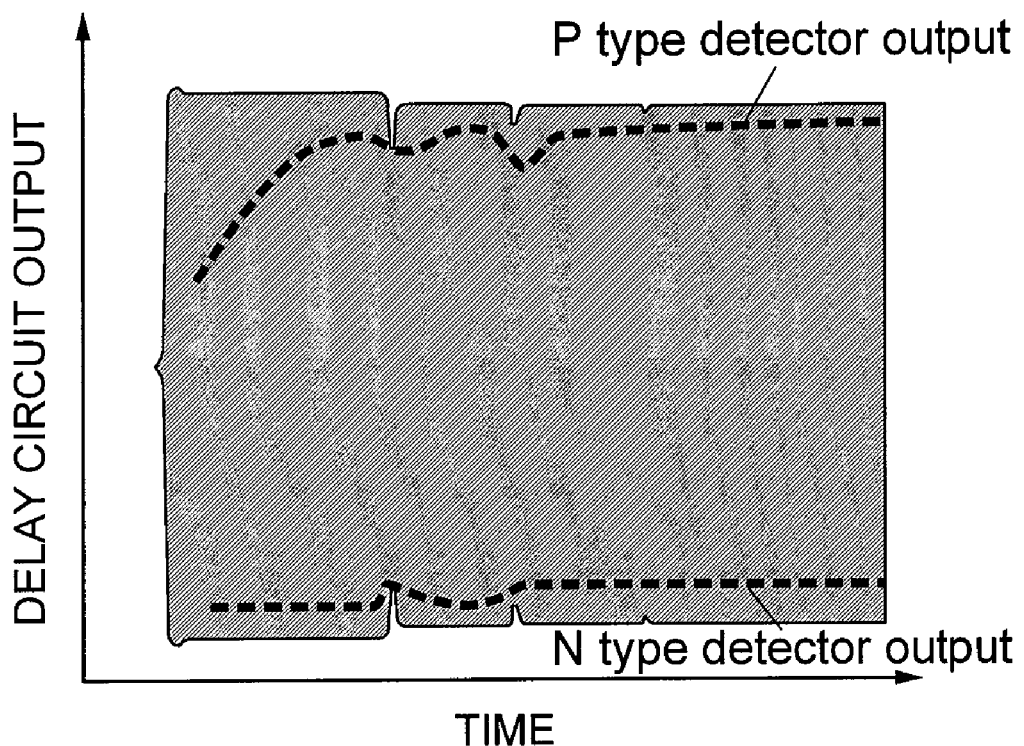
[FIG. 4]
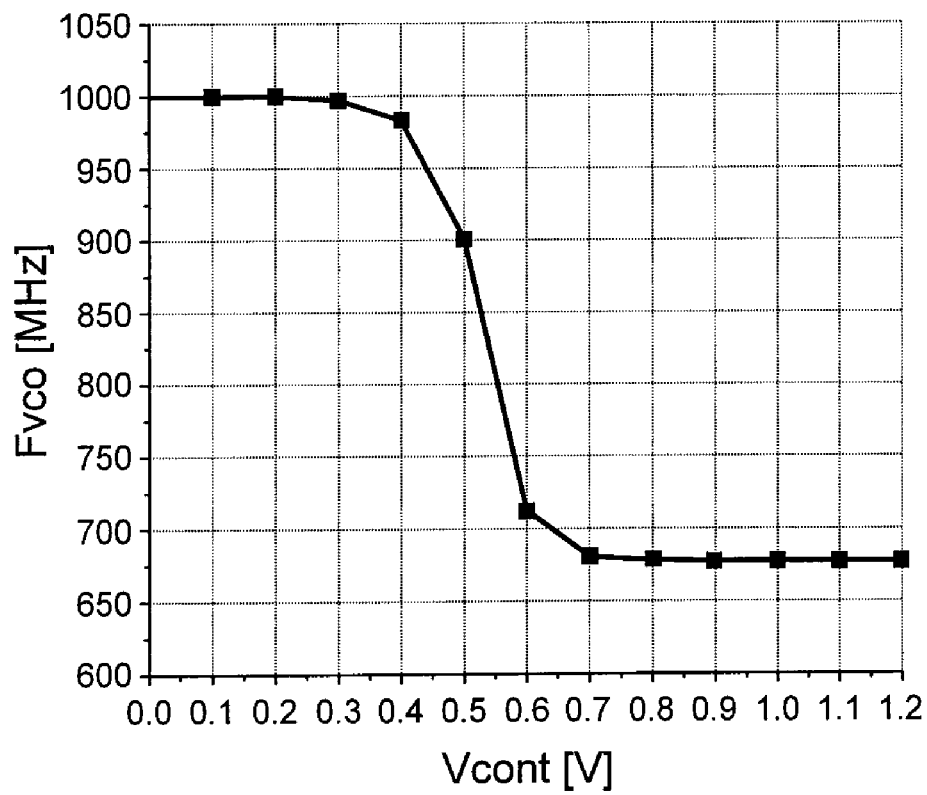

[FIG. 5]
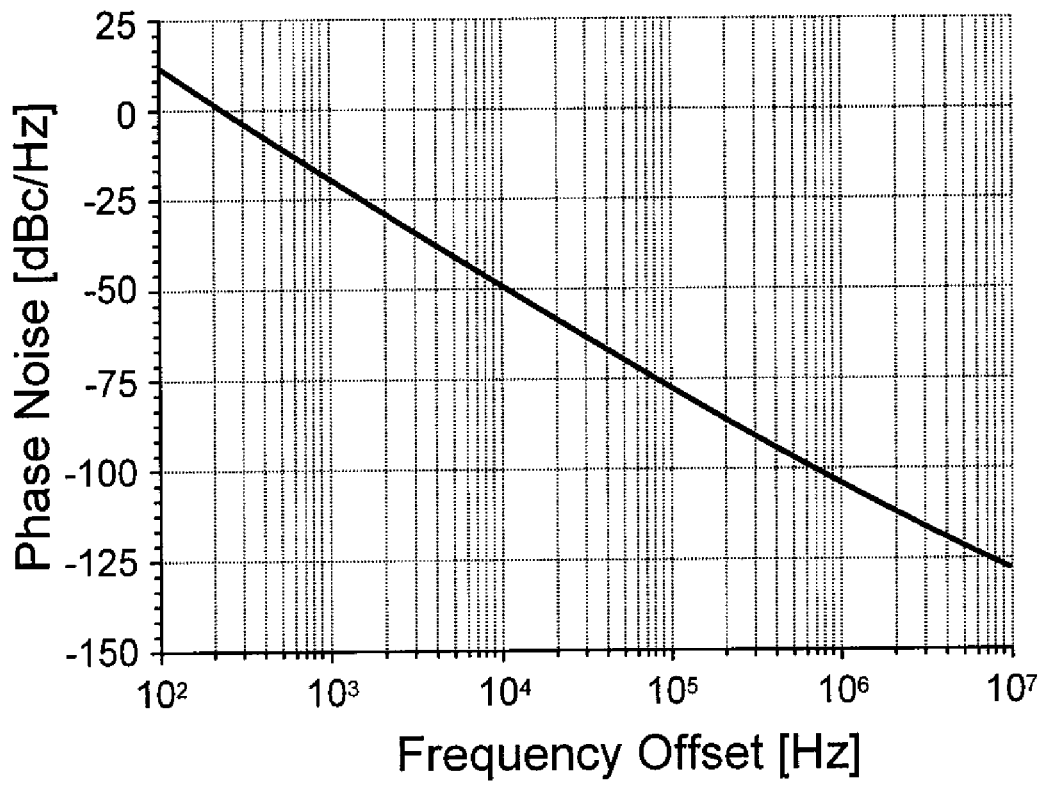
[FIG. 6]
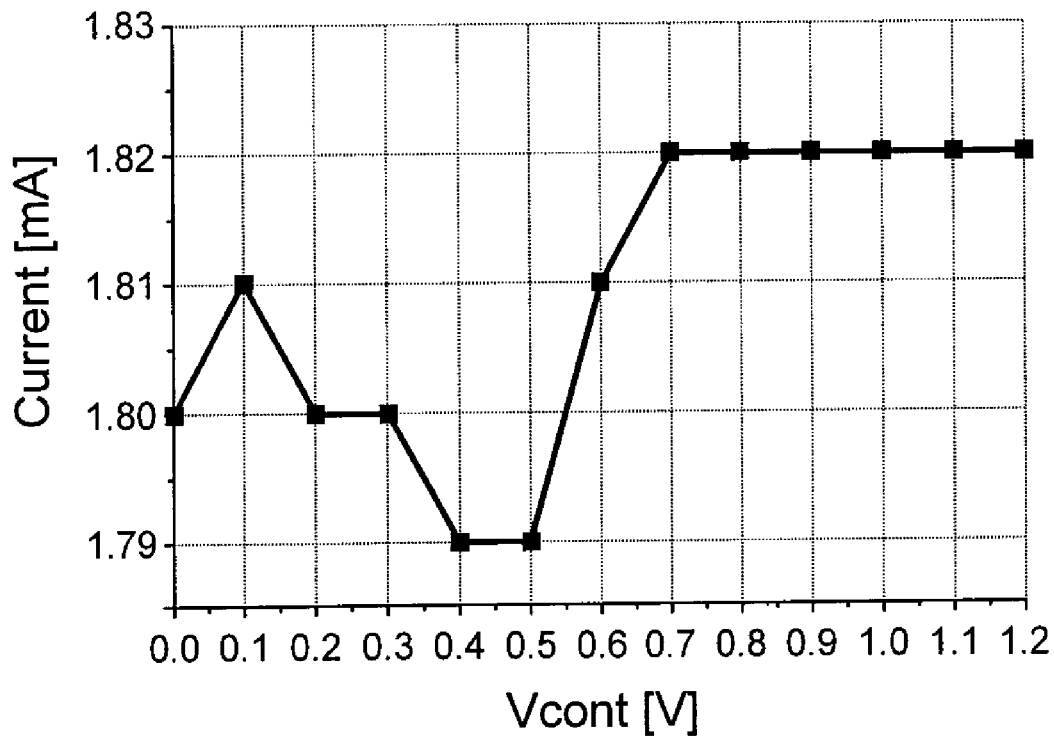

DELAY CIRCUIT FOR LOW POWER RING OSCILLATOR

CROSS REFERENCE TO RELATED APPLICATION

This application claims the benefit of Korean Patent Application No. 10-2010-0057583, filed on Jun. 17, 2010, entitled "Delay Circuit For Low Power Ring Oscillator", which is hereby incorporated by reference in its entirety into this application.

BACKGROUND OF THE INVENTION

1. Technical Field

The present invention relates to a delay circuit for a low power ring oscillator, and more particularly, to a technology for improving an operation frequency of a delay circuit while simultaneously minimizing current consumption thereof.

2. Description of the Related Art

Recently, due to the demands for low cost and low power wireless radio, the use of Zigbee technology according to the IEEE 802.15.4 standard has increased. Therefore, solutions using Zigbee have been developed in various fields such as a smart grid power system, a building control, an LED illumination field, and the like.

In addition, the development of a wireless radio technology using Zigbee at 868/915 MHz has actively progressed due to an advantage of transmitting/receiving distance or the like. However, in the case of 900 MHz band, an area of an inductor used in an amplifier, a mixer, an oscillator, or the like is increased as compared to the known 2.4 GHz band. The inductor, therefore, is almost the size of a chip, such that the manufacturing cost of a Zigbee chip is increased.

There is thus an increasing demand for an oscillator that does not use an inductor, as an oscillator for a wireless radio at 900 MHz band. As an example of the oscillator, the use of a ring oscillator has been recently considered. However, the ring oscillator has disadvantages such as high phase noise, a narrow frequency range, and large current consumption, as compared to the known LC oscillator. Therefore, there is a demand for a delay circuit capable of overcoming the disadvantages of such a ring oscillator.

SUMMARY OF THE INVENTION

An object of the present invention is to provide a delay circuit for a ring oscillator that includes an N type detector and a P type detector to minimize current consumption of the delay circuit and control an operation frequency thereof in various ranges by controlling a control voltage.

According to an exemplary embodiment of the present invention, there is provided a delay circuit for a low power ring oscillator, including: a pair of N type transistors that receive first differential input signals Vin1+ and Vin1−; a pair of P type transistors that receive second differential input signals Vin2+ and Vin2−; a differential output terminal that outputs differential output signals Vout+ and Vout− generated from the pair of N type transistors and the pair of P type transistors; an N type detector that supplies a body voltage to the pair of N type transistors; and a P type detector that supplies a body voltage to the pair of P type transistors.

In this case, the pair of N type transistors may include a first transistor and a second transistor, wherein the gates G of the first transistor and the second transistor each are input with the negative input signal Vin1− and the positive input signal Vin1+ of the first differential input signals and the sources S of the first transistor and the second transistor are connected with a second power supply terminal Vss.

The pair of P type transistors may include a third transistor and a fourth transistor, wherein the gates G of the third transistor and the fourth transistor each are input with the negative input signal Vin2− and the positive input signal Vin2+ of the second differential input signals and the sources S of the third transistor and the fourth transistor are connected with a first power supply terminal Vdd, the drain D of the third transistor is connected with the drain D of the first transistor, and the drain D of the fourth transistor is connected with the drain D of the second transistor.

The differential output terminal may include a negative output terminal that outputs the negative output signal Vout− of the differential output signal and a positive output terminal that outputs the positive output signal Vout+ of the differential output signal, wherein the negative output terminal is connected with the drain D of the first transistor and the drain D of the third transistor, and the positive output terminal is connected with the drain D of the second transistor and the drain D of the fourth transistor.

Meanwhile, the N type detector may include a fifth transistor and a sixth transistor, wherein the source S of the fifth transistor is connected with the body B of the first transistor and the body B of the second transistor, the gate G of the fifth transistor is connected with the drain D of the sixth transistor, and the drain D of the fifth transistor is connected with the negative output terminal, the source S of the sixth transistor is connected with the body of the first transistor and the body B of the second transistor, the gate G of the sixth transistor is connected with the drain D of the fifth transistor, and the drain D of the sixth transistor is connected with the positive output terminal.

In this case, the fifth transistor and the sixth transistor may be each an N type transistor.

The P type detector may include a seventh transistor and an eighth transistor, wherein the source S of the seventh transistor is connected with the body B of the third transistor and the body B of the fourth transistor, the gate G of the seventh transistor is connected with the drain D of the eighth transistor, and the drain D of the seventh transistor is connected with the negative output terminal, the source S of the eighth transistor is connected with the body B of the third transistor and the body B of the fourth transistor, the gate G of the eighth transistor is connected with the drain D of the seventh transistor, and the drain D of the eighth transistor is connected with the positive output terminal.

In this case, the seventh transistor and the eighth transistor may be each a P type transistor.

Meanwhile, the delay circuit for a low power ring oscillator may further include a delay controller that controls the delay values of the delay circuit.

In this case, the delay controller may include a ninth transistor, a tenth transistor, and an eleventh transistor, wherein the source S of the ninth transistor is connected with the drain D of the eleventh transistor, the gate G of the ninth transistor is connected with the drain D of the tenth transistor, and the drain D of the ninth transistor is connected with the drain D of the first transistor, the source S of the tenth transistor is connected with the drain D of the eleventh transistor, the gate G of the tenth transistor is connected with the drain D of the ninth transistor, and the drain D of the tenth transistor is connected with the drain D of the second transistor, and the source of the eleventh transistor is connected to the second power supply terminal Vss.

In this case, the ninth transistor, the tenth transistor, and the eleventh transistor may be each an N type transistor.

The delay controller may control the delay values of the delay circuit by controlling a voltage Vcont supplied to the gate G of the eleventh transistor.

BRIEF DESCRIPTION OF THE DRAWINGS

FIG. 1 is a circuit diagram showing a delay circuit 100 for a low power ring oscillator according to an embodiment of the present invention;

FIG. 2 is a block diagram showing a low power ring oscillator 200 including the delay circuit 100 according to an embodiment of the present invention;

FIG. 3 is a graph for explaining effects of the N type detector 104 and the P type detector 106 included in the delay circuit 100 according to an embodiment of the present invention;

FIG. 4 is a graph showing the change in frequency of the low power ring oscillator 200 according to the change in Vcont of the delay circuit 100 according to an embodiment of the present invention;

FIG. 5 is a graph showing the change in phase noise according to the frequency offset of the delay circuit 100 according to an embodiment of the present invention; and FIG. 6 is a graph showing the current consumption of the delay circuit 100 according to an embodiment of the present invention.

DESCRIPTION OF THE PREFERRED EMBODIMENTS

Hereinafter, exemplary embodiments of the present invention will be described with reference to the accompanying drawings. However, the exemplary embodiments are described by way of examples only and the present invention is not limited thereto.

In describing the present invention, if a detailed description of well-known technology relating to the present invention may unnecessarily make unclear the spirit of the present invention, a detailed description thereof will be omitted. Further, the following terminologies are defined in consideration of the functions in the present invention and may be construed in different ways by the intention of users and operators. Therefore, the definitions thereof should be construed based on the contents throughout the specification.

As a result, the spirit of the present invention is determined by the claims and the following exemplary embodiments may be provided to efficiently describe the spirit of the present invention to those skilled in the art.

FIG. 1 is a circuit diagram showing a delay circuit 100 for a low power ring oscillator according to an embodiment of the present invention.

As shown in the figure, the delay circuit 100 for a low power ring oscillator according to an embodiment of the present invention is configured to include a pair of N type transistors M1 and M2, a pair of P type transistors M3 and M4, a differential output terminal 102, an N type detector 104, a P type detector 106, and a delay controller 108.

The pair of N type transistors M1 and M2 are transistors that receive first differential input signals Vin1+ and Vin1−. The first differential input signals Vin1+ and Vin1− are differential output signals output from a delay circuit in a previous stage of the low power ring oscillator.

The pair of N type transistors M1 and M2 includes a first transistor M1 and a second transistor M2. The gates G of the first transistor M1 and the second transistor M2 are each applied with a negative input signal Vin1− and a positive input signal Vin1+ of the first differential input signals Vin1+ and Vin1−, and the sources S of the first transistor M1 and the second transistor M2 are connected with a second power supply terminal Vss.

Next, the pair of P type transistors M3 and M4 are transistors that receive second differential input signals Vin2+ and Vin2−. The second differential input signals Vin2+ and Vin2− are differential output signals output from a delay circuit in a stage prior to the previous stage of the low power ring oscillator, that is, positioned before two stages. The first differential input signals Vin1+ and Vin1− and the second differential input signals Vin2+ and Vin2− will be described in detail with reference to FIG. 2.

The pair of P type transistors M3 and M4 includes a third transistor M3 and a fourth transistor M4. The gates G of the third transistor M3 and the fourth transistor M4 are each input with a negative input signal Vin2− and a positive input signal Vin2+ of the second differential input signals, and the sources S of the third transistor M3 and the fourth transistor M4 are connected with a first power supply terminal Vdd. In addition, the drain D of the third transistor M3 is connected with the drain D of the first transistor M1, and the drain D of the fourth transistor is connected to the drain D of the second transistor M2.

Next, the differential output terminal 102 outputs differential output signals Vout+ and Vout− generated from the pair of N type transistors M1 and M2 and the pair of P type transistors M3 and M4. The differential output terminal 102 includes a negative output terminal that outputs the negative output signal Vout− of the differential output signal and a positive output terminal that outputs the positive output signal Vout+ thereof, wherein the negative output terminal is connected with the drain D of the first transistor M1 and the drain D of the third transistor M3, and the positive output terminal is connected with the drain D of the second transistor M2 and the drain D of the fourth transistor M4.

The N type detector 104 is a module that reduces a threshold voltage of the pair of N type transistors M1 and M2 by supplying a body voltage to the pair of N type transistors M1 and M2. The N type detector 104 is configured to include a fifth transistor M5 and a sixth transistor M6. The fifth transistor M5 and the sixth transistor M6 are each an N type transistor, wherein the source S of the fifth transistor M5 is connected with the body B of the first transistor M1 and the body B of the second transistor M2, and the gate G thereof is connected with the drain D of the sixth transistor M6, the drain D being connected with the negative output terminal. In addition, the source S of the sixth transistor M6 is connected with the body of the first transistor M1 and the body B of the second transistor M2, and the gate G thereof is connected with the drain D of the fifth transistor M5, the drain D being connected with the positive output terminal.

Next, the P type detector 106 is a module that reduces a threshold voltage of the pair of P type transistors M3 and M4 by supplying a body voltage to the pair of P type transistors M3 and M4. The P type detector 106 is configured to include a seventh transistor M7 and an eighth transistor M8. The seventh transistor M7 and the eighth transistor M8 are each a P type transistor, wherein the source S of the seventh transistor M7 is connected with the body B of the third transistor M3 and the body B of the fourth transistor M4, and the gate G thereof is connected with the drain D of the eighth transistor M8, the drain D being connected with the negative output terminal. In addition, the source S of the eighth transistor M8 is connected with the body B of the third transistor M3 and the body B of the fourth transistor M4, and the gate G thereof is connected with the drain D of the seventh transistor M7, the drain D being connected with the positive output terminal.

Finally, the delay controller 108 is a module that controls the delay values of the delay circuit 100 for a low power ring oscillator. As shown in the figure, the delay controller 108 includes a ninth transistor M9, a tenth transistor M10, and an eleventh transistor M11. The ninth transistor M9, the tenth transistor M10, and the eleventh transistor M11 are each an N type transistor. The source S of the ninth transistor M9 is connected with the drain D of the eleventh transistor M11, and the gate G thereof is connected to the drain D of the tenth transistor M10, the drain D being connected with the drain D of the first transistor M1. The source S of the tenth transistor M10 is connected with the drain D of the eleventh transistor M11, and the gate G thereof is connected to the drain D of the ninth transistor M9, the drain D being connected with the drain D of the second transistor M2. In addition, the source of the eleventh transistor M11 is connected with the second power supply terminal Vss.

The delay controller 108 constituted as above controls the voltage Vcont supplied to the gate G of the eleventh transistor M11, thereby controlling the delay values of the delay circuit 100.

FIG. 2 is a block diagram showing a low power ring oscillator 200 including a delay circuit 100 according to an embodiment of the present invention.

The lower power ring oscillator 200 according to an embodiment of the present invention is configured to have a shape in which the plurality of delay circuits 100 of FIG. 1 are connected in series. Each of the delay circuits 100 receives the first differential input signals Vin1+ and Vin1− and the second differential input signals Vin2+ and Vin2− and outputs the differential output signals Vout+ and Vout−. In this case, the first differential input signals Vin1+ and Vin1− are differential output signals output from the delay circuit in the previous stage and the second differential input signals Vin2+ and Vin2− are differential output signals output from the delay circuit in the stage prior to the previous stage. When signals prior to the input signals of the pair of N type transistors M1 and M2 are applied to the pair of P type transistors M3 and M4 provided in the delay circuit 100 as described above, the pair of P type transistors M3 and M4 are turned on prior to the pair of N type transistors M1 and M2, thereby making it possible to improve the operation frequency of the low power ring oscillator 200 and reduce phase noise.

Next, the operation of the delay circuit 100 constituted as above and the low power ring oscillator 200 including the same will be described.

In general, the switching operation of the transistor should be normally performed while simultaneously minimizing the size of the transistor used in the delay circuit 100 in order to minimize current consumption in the delay circuit 100 for a low power ring oscillator. To this end, a threshold voltage of each transistor used in the delay circuit 100 should be lowered.

When a forward bias voltage is applied to the source S of the transistor, the threshold voltage Vth becomes $$|V_{th}|=|V_{tho}|+\gamma\sqrt{2|\varnothing_f|-V_{ab}}-\sqrt{2|\varnothing_f|}\text{ in PMOS}$$

$$|V_{th}|=|V_{tho}|+\gamma\sqrt{2|\varnothing_f|-V_{bs}}-\sqrt{2|\varnothing_f|}\text{ in NMOS}$$

Therefore, if Vsb and Vbs of the transistor are increased, the threshold voltage can be lowered.

However, when the body voltages of the first transistor M1, the second transistor M2, the third transistor M3, and the fourth transistor M4 constituting the delay circuit 100 are applied using a separate voltage supplier, an additional voltage control circuit therefore is needed. This causes an increase in the size and the current consumption of the delay circuit 100. Therefore, the delay circuit 100 according to an embodiment of the present invention is configured to supply the body voltages to the first transistor M1, the second transistor M2, the third transistor M3, and the fourth transistor M4 using the N type detector 104 an the P type detector 106.

FIG. 3 is a graph for explaining effects of the N type detector 104 and the P type detector 106 included in the delay circuit 100 according to an embodiment of the present invention.

As shown in the figure, if the N type detector 104 is turned on, the lowest peak values of the output signal of the delay circuit 100 are detected. To the contrary, if the P type detector 106 is turned on, the highest peak values of the output signal of the delay circuit 100 are detected. The lowest peak values of the output signal detected as above are supplied to the first transistor M1 and the second transistor M2, and the highest peak values thereof are supplied to the third transistor M3 and the fourth transistor M4, such that the threshold voltage of each of the transistor is lowered. Therefore, each of the transistors stably performs the switching operation and the low power ring oscillator 200 is normally operated without additional current consumption even under the environment in which the output signal is lowered.

Next, the function of the delay controller 108 provided in the delay circuit 100 will be described. The delay controller 108 controls the frequency of the low power ring oscillator 200 by controlling the delays of each delay circuit 100 according to a control voltage Vcont.

In the delay circuit 100 of FIG. 1, impedance represented by the drain D of the ninth transistor M9 and the tenth transistor M10 is as follows.

$$-\frac{2}{gm}$$

Therefore, a time delay $T_d$ of the delay circuit 100 is determined as follows.

$$T_d \approx \frac{1}{R_{sw}C_L} \approx \frac{1}{\left(R_{sw}-\frac{2}{g_m}\right)C_L}$$

In the equation, $g_m$ is determined as follows.

$$g_m = \frac{\partial I_{d,cross-coupled}}{\partial V_{gs}} = \frac{2I_{d,cross-coupled}}{V_{gs}-V_{th}} = \frac{I_{d,M11}}{V_{gs}-V_{th}}$$

$$I_{d,M11} = \frac{1}{2}K_m\frac{W}{L}(V_{cont}-V_{th})^2$$

As a result, according to the equations, if the gate voltage Vcont applied to the eleventh transistor is controlled, it is possible to control the frequency of the low power ring oscillator 200. The change in frequency of the low power ring oscillator 200 according to the change in the Vcont is shown in FIG. 4. It can be appreciated, from the graph, that the frequency range of the low power ring oscillator 200 is 40% or more of the maximum frequency.

FIG. 5 is a graph showing the change in phase noise according to the frequency offset of the delay circuit 100 according to an embodiment of the present invention, and FIG. 6 is a graph showing the current consumption of the delay circuit 100 according to an embodiment of the present invention. It can be appreciated, from the graph, that the delay circuit 100 according to the present invention has the maximum phase noise of −106 dB/Hz, which is significantly reduced as compared to the related art. In addition, even though the gate voltage of the eleventh transistor M11 is changed, current consumption is maintained at 1.8 mA. Therefore, it can be appreciated that current consumption is also very small.

According to the present invention, the delay circuit used in the ring oscillator includes the N type detector and the P type detector, thereby making it possible to minimize current consumption in the delay circuit. In addition, the delay circuit does not use a separate inductor, thereby making it possible to be implemented in a narrow chip area and minimize phase noise. In addition, the delay circuit controls a control voltage, thereby making it possible to control the operation frequency in various ranges.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, the scope of the present invention is not construed as being limited to the described embodiments but is defined by the appended claims as well as equivalents thereto.

What is claimed is:

1. A delay circuit for a low power ring oscillator, comprising:
    a pair of N type transistors that receive first differential input signals Vin1+ and Vin1−;
    a pair of P type transistors that receive second differential input signals Vin2+ and Vin2−;
    a differential output terminal that outputs differential output signals Vout+ and Vout− generated from the pair of N type transistors and the pair of P type transistors;
    an N type detector that supplies a body voltage to the pair of N type transistors; and
    a P type detector that supplies a body voltage to the pair of P type transistors.

2. The delay circuit for a low power ring oscillator according to claim 1, wherein the pair of N type transistors includes a first transistor and a second transistor,
    the gates G of the first transistor and the second transistor each being input with the negative input signal Vin1− and the positive input signal Vin1+ of the first differential input signals and the sources S of the first transistor and the second transistor being connected with a second power supply terminal Vss.

3. The delay circuit for a low power ring oscillator according to claim 2, wherein the pair of P type transistors includes a third transistor and a fourth transistor,
    the gates G of the third transistor and the fourth transistor each being input with the negative input signal Vin2− and the positive input signal Vin2+ of the second differential input signals and the sources S of the third transistor and the fourth transistor being connected with a first power supply terminal Vdd, the drain D of the third transistor being connected with the drain D of the first transistor, and the drain D of the fourth transistor being connected with the drain D of the second transistor.

4. The delay circuit for a low power ring oscillator according to claim 3, wherein the differential output terminal includes a negative output terminal that outputs the negative output signal Vout− of the differential output signal and a positive output terminal that outputs the positive output signal Vout+ of the differential output signal, the negative output terminal being connected with the drain D of the first transistor and the drain D of the third transistor, and the positive output terminal being connected with the drain D of the second transistor and the drain D of the fourth transistor.

5. The delay circuit for a low power ring oscillator according to claim 4, wherein the N type detector includes a fifth transistor and a sixth transistor,
    the source S of the fifth transistor being connected with the body B of the first transistor and the body B of the second transistor, the gate G of the fifth transistor being connected with the drain D of the sixth transistor, and the drain D of the fifth transistor being connected with the negative output terminal,
    the source S of the sixth transistor being connected with the body of the first transistor and the body B of the second transistor, the gate G of the sixth transistor being connected with the drain D of the fifth transistor, and the drain D of the sixth transistor being connected with the positive output terminal.

6. The delay circuit for a low power ring oscillator according to claim 5, wherein the fifth transistor and the sixth transistor are each an N type transistor.

7. The delay circuit for a low power ring oscillator according to claim 4, wherein the P type detector includes a seventh transistor and an eighth transistor,
    the source S of the seventh transistor being connected with the body B of the third transistor and the body B of the fourth transistor, the gate G of the seventh transistor being connected with the drain D of the eighth transistor, and the drain D of the seventh transistor being connected with the negative output terminal,
    the source S of the eighth transistor being connected with the body B of the third transistor and the body B of the fourth transistor, the gate G of the eighth transistor being connected with the drain D of the seventh transistor, and the drain D of the eighth transistor being connected with the positive output terminal.

8. The delay circuit for a low power ring oscillator according to claim 7, wherein the seventh transistor and the eighth transistor are each a P type transistor.

9. The delay circuit for a low power ring oscillator according to claim 4, further comprising a delay controller that controls the delay values of the delay circuit.

10. The delay circuit for a low power ring oscillator according to claim 9, wherein the delay controller includes a ninth transistor, a tenth transistor, and an eleventh transistor,
    the source S of the ninth transistor being connected with the drain D of the eleventh transistor, the gate G of the ninth transistor being connected with the drain D of the tenth transistor, and the drain D of the ninth transistor being connected with the drain D of the first transistor,
    the source S of the tenth transistor being connected with the drain D of the eleventh transistor, the gate G of the tenth transistor being connected with the drain D of the ninth transistor, and the drain D of the tenth transistor being connected with the drain D of the second transistor, and
    the source of the eleventh transistor being connected to the second power supply terminal Vss.

11. The delay circuit for a low power ring oscillator according to claim 10, wherein the ninth transistor, the tenth transistor, and the eleventh transistor are each an N type transistor.

12. The delay circuit for a low power ring oscillator according to claim 10, wherein the delay controller controls the delay values of the delay circuit by controlling a voltage Vcont supplied to the gate G of the eleventh transistor.

* * * * *